(12) United States Patent
Shi et al.

(10) Patent No.: US 11,254,839 B2
(45) Date of Patent: Feb. 22, 2022

(54) LOW OXIDE TRENCH DISHING SHALLOW TRENCH ISOLATION CHEMICAL MECHANICAL PLANARIZATION POLISHING

(71) Applicant: Versum Materials US, LLC, Tempe, AZ (US)

(72) Inventors: Xiaobo Shi, Chandler, AZ (US); Joseph D. Rose, Gilbert, AZ (US); Hongjun Zhou, Chandler, AZ (US); Krishna P. Murella, Phoenix, AZ (US); Mark Leonard O'Neill, Queen Creek, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/711,818

(22) Filed: Dec. 12, 2019

(65) Prior Publication Data
US 2021/0179890 A1 Jun. 17, 2021

(51) Int. Cl.
| | | |
|---|---|---|
| *C09G 1/02* | (2006.01) | |
| *H01L 21/3105* | (2006.01) | |
| *B24B 37/04* | (2012.01) | |
| *C09K 3/14* | (2006.01) | |
| C09G 1/06 | (2006.01) | |
| H01L 21/306 | (2006.01) | |

(52) U.S. Cl.
CPC ............... *C09G 1/02* (2013.01); *B24B 37/044* (2013.01); *C09K 3/1436* (2013.01); *H01L 21/31053* (2013.01); *C09G 1/06* (2013.01); *H01L 21/30625* (2013.01)

(58) Field of Classification Search
CPC ....... A61K 31/47; A61P 35/00; C07D 215/20; C07D 215/22; C09G 1/02; C09G 1/06; C23F 1/00; C23F 1/10; B24B 37/044; C09K 3/1436; C09K 3/1445; H01L 21/31053; H01L 21/30625
USPC ..... 252/79.1, 79.2, 79.3; 438/691, 692, 693; 156/345.1, 345.12
See application file for complete search history.

(56) References Cited

U.S. PATENT DOCUMENTS

| | | | |
|---|---|---|---|
| 5,876,490 A | 3/1999 | Ronay | |
| 6,616,514 B1 | 9/2003 | Edelbach et al. | |
| 6,964,923 B1 | 11/2005 | Ronay | |
| 8,083,964 B2 * | 12/2011 | Yamada | C09G 1/02 216/88 |
| 10,851,266 B2 * | 12/2020 | Lee | H01L 21/30625 |
| 2002/0173243 A1 | 11/2002 | Costas et al. | |
| 2003/0196386 A1 | 10/2003 | Hattori et al. | |
| 2007/0186484 A1 | 8/2007 | Yamashita et al. | |
| 2008/0206995 A1 * | 8/2008 | Tomiga | H01L 21/3212 438/693 |
| 2012/0077419 A1 | 3/2012 | Zhang et al. | |
| 2017/0133236 A1 | 5/2017 | Murella et al. | |
| 2017/0283673 A1 | 10/2017 | Zhou et al. | |
| 2020/0123412 A1 * | 4/2020 | Peng | H01L 21/3212 |

FOREIGN PATENT DOCUMENTS

WO    2008078909 A1    7/2008

* cited by examiner

*Primary Examiner* — Lan Vinh
(74) *Attorney, Agent, or Firm* — Lina Yang

(57) ABSTRACT

The present invention discloses STI CMP polishing compositions, methods and systems that significantly reduce oxide trench dishing and improve over-polishing window stability in addition to provide high and tunable silicon oxide removal rates, low silicon nitride removal rates, and tunable high selectivity of $SiO_2$:SiN through the use of an unique combination of ceria inorganic oxide particles, such as ceria coated silica particles as abrasives, and an oxide trench dishing reducing additive of poly(methacrylic acids), its derivatives, its salts, or combinations thereof.

22 Claims, No Drawings

LOW OXIDE TRENCH DISHING SHALLOW TRENCH ISOLATION CHEMICAL MECHANICAL PLANARIZATION POLISHING

BACKGROUND OF THE INVENTION

This invention relates to Shallow Trench Isolation (STI) chemical Mechanical Planarization (CMP) polishing compositions.

More specifically, the STI chemical Mechanical Planarization (CMP) polishing compositions use ceria-coated composite particles, such as ceria-coated silica particles as abrasives and poly (methacrylic acid) (PMAA), its derivatives, or its salts with molecular weight ranged from 1,000 to 1,000,000; or combinations thereof as chemical additive for achieving low oxide trenching dishing for Shallow Trench Isolation (STI) process.

In the fabrication of microelectronics devices, an important step involved is polishing, especially surfaces for chemical-mechanical polishing for recovering a selected material and/or planarizing the structure.

For example, a SiN layer is deposited under a $SiO_2$ layer to serve as a polish stop. The role of such polish stop is particularly important in Shallow Trench Isolation (STI) structures. Selectivity is characteristically expressed as the ratio of the oxide polish rate to the nitride polish rate. An example is an increased polishing selectivity rate of silicon dioxide ($SiO_2$) as compared to silicon nitride (SiN).

In the global planarization of patterned STI structures, reducing oxide trench dishing is a key factor to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

U.S. Pat. No. 5,876,490 discloses the polishing compositions containing abrasive particles and exhibiting normal stress effects. The slurry further contains non-polishing particles resulting in reduced polishing rate at recesses, while the abrasive particles maintain high polish rates at elevations. This leads to improved planarization. More specifically, the slurry comprises cerium oxide particles and polymeric electrolyte, and can be used for Shallow Trench Isolation (STI) polishing applications.

U.S. Pat. No. 6,964,923 teaches the polishing compositions containing cerium oxide particles and polymeric electrolyte for Shallow Trench Isolation (STI) polishing applications. Polymeric electrolyte being used includes the salts of polyacrylic acid, similar as those in U.S. Pat. No. 5,876,490. Ceria, alumina, silica & zirconia are used as abrasives. Molecular weight for such listed polyelectrolyte is from 300 to 20,000, but in overall, <100,000.

U.S. Pat. No. 6,616,514 discloses a chemical mechanical polishing slurry for use in removing a first substance from a surface of an article in preference to silicon nitride by chemical mechanical polishing. The chemical mechanical polishing slurry according to the invention includes an abrasive, an aqueous medium, and an organic polyol that does not dissociate protons, said organic polyol including a compound having at least three hydroxyl groups that are not dissociable in the aqueous medium, or a polymer formed from at least one monomer having at least three hydroxyl groups that are not dissociable in the aqueous medium.

However, those prior disclosed Shallow Trench Isolation (STI) polishing compositions did not address the importance of oxide trench dishing reducing.

It should be readily apparent from the foregoing that there remains a need within the art for compositions, methods and systems of chemical mechanical polishing that can afford the reduced oxide trench dishing and improved over polishing window stability in a STI chemical and mechanical polishing (CMP) process, in addition to high removal rate of silicon dioxide as well as high selectivity for silicon dioxide to silicon nitride.

BRIEF SUMMARY OF THE INVENTION

The present invention discloses Chemical mechanical polishing (CMP) compositions that provide reduced oxide trench dishing and thus improved over polishing window stability for Shallow Trench Isolation (STI) CMP applications at wide pH range including acidic, neutral and alkaline pH conditions.

The CMP compositions also provide good oxide film removal rates, suppressed SiN film removal rates and tunable higher $SiO_2$:SiN selectivity.

The disclosed chemical mechanical polishing (CMP) compositions for Shallow Trench Isolation (STI) CMP applications have a unique combination of using ceria-coated inorganic oxide abrasive particles and an oxide trench dishing reducing additives including poly(methacrylic acids) (PMAA), its derivatives, its salts with molecular weight ranging from 1000 to 1,000,000; or combinations thereof.

In one aspect, there is provided a STI CMP polishing composition comprises:
ceria-coated inorganic oxide particles;
oxide trenching dishing reducer selected from the group consisting of organic polymer acid, its ester derivatives, its salts, and combinations thereof;
water based solvent; and
optionally
biocide; and
pH adjuster;
wherein
the composition has a pH of 2 to 12, 3 to 10, 3.5 to 9, or 4 to 7;
and
molecular weight of oxide trenching dishing reducer is from 1,000 to 1,000,000, preferably 1,200 to 100,000, more preferably 1,500 to 15,000.

The ceria-coated inorganic oxide particles include, but are not limited to, ceria-coated colloidal silica, ceria-coated high purity colloidal silica, ceria-coated alumina, ceria-coated titania, ceria-coated zirconia, or any other ceria-coated inorganic oxide particles. The preferred ceria-coated inorganic oxide particles are ceria-coated colloidal silica.

The water-soluble based solvent includes but is not limited to deionized (DI) water, distilled water, and alcoholic organic water-based solvents.

The organic polymer acid, its ester derivatives, or its salts used as oxide trench dishing reducers have a general molecular structure as shown below:

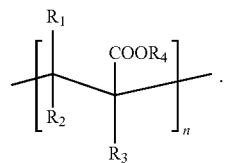

Where R1, R2, and R4 each can be selected independently from the group consisting of hydrogen, alkyl groups; R4 can also be metal ions or ammonium ions, such as Na+, K+ or NH4+; and R3 is selected from alkyl groups. Where the alkyl groups are $C_mH_{2m+1}$ m is from 1 to 10, 1 to 6, 1 to 4, or 1 to 2; such as methyl, ethyl groups.

n is chosen to give the molecular weights of the oxide trenching dishing reducer in the range from 1,000 to 1,000,000; preferably 1,200 to 100,000; and more preferably 1,500 to 15,000.

When R1, R2, and R4 are hydrogen atoms and R3 is methyl group, the molecular structure of poly(methacrylic acid) is shown below:

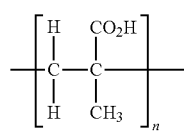

(a)

When R1 and R2 are hydrogen atoms, R3 is methyl group, and R4 is ammonium ion or a metal such as sodium ion, or potassium ion; then the molecular structure of poly (methacrylic acid) salts is shown below:

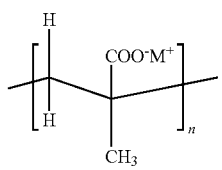

(b)

The poly (methacrylic acid) salts include but are not limited to poly (methacrylic acid) ammonium salts, poly (methacrylic acid) sodium salts, poly (methacrylic acid) potassium salts, or combinations thereof. The preferred polyacrylic acid salt is poly (methacrylic acid) ammonium salt.

When R1 and R2 are hydrogen atoms, R3 and R4 are methyl group, the molecular structure of poly (methyl methacrylate) (PMMA) is shown below:

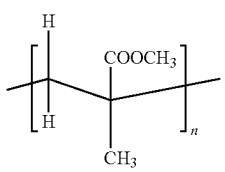

(c)

When R1 and R2 are hydrogen atoms, R3 is methyl group, and R4 is ethyl group, the molecular structure of poly (ethyl methacrylate) (PEMA) is shown below:

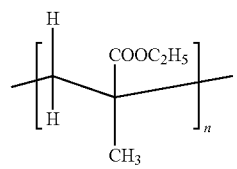

(d)

When R1 and R4 are hydrogen atoms, R2 and R3 are methyl group, the molecular structure of 2-methyl-poly (methacrylic acid) is shown below:

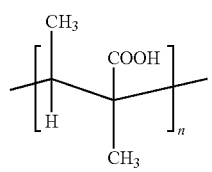

(e)

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished silicon oxide films can be Chemical vapor deposition (CVD), Plasma Enhance CVD (PECVD), High Density Deposition CVD (HDP), or spin on oxide films.

The substrate disclosed above can further comprises a silicon nitride surface. The removal selectivity of $SiO_2$:SiN is greater than 10, preferably greater than 15.

DETAILED DESCRIPTION OF THE INVENTION

This invention relates to the Chemical mechanical polishing (CMP) compositions for Shallow Trench Isolation (STI) CMP applications generally using the ceria-coated inorganic oxide particles as abrasives and poly(methacrylic acids)(PMAA), its derivatives, its salts, and combinations thereof as the suitable chemical additives which provide the benefits of achieving high oxide film removal rates, low SiN film removal rates, high and tunable Oxide: SiN selectivity, and more importantly, significantly reducing oxide trench dishing and improving over polishing window stability.

In the global planarization of patterned STI structures, reducing oxide trench dishing is a key factor to be considered. The lower trench oxide loss will prevent electrical current leaking between adjacent transistors. Non-uniform trench oxide loss across die (within Die) will affect transistor performance and device fabrication yields. Severe trench oxide loss (high oxide trench dishing) will cause poor isolation of transistor resulting in device failure. Therefore, it is important to reduce trench oxide loss by reducing oxide trench dishing in STI CMP polishing compositions.

In one aspect, there is provided a STI CMP polishing composition comprises:
ceria-coated inorganic oxide particles;
oxide trenching dishing reducer selected from organic polymer acid, its ester derivatives, its salts, and combinations thereof;
water based solvent; and
optionally biocide; and
pH adjuster;
wherein
the composition has a pH of 2 to 12, 3 to 10, 3.5 to 9, or 4 to 8;
the molecular weight of oxide trenching dishing reducer is in the ranges of 1,000 to 1,000,000, preferably 1,200 to 100,000, more preferably 1,500 to 15,000.

The oxide trenching dishing reducer also includes 2-alkyl group substituted derivatives of the organic polymer acid, where 2-alkyl group includes methyl, ethyl, propyl, butyl, pentyl or hexyl group.

The ceria-coated inorganic oxide particles include, but are not limited to, ceria-coated colloidal silica, ceria-coated high purity colloidal silica, ceria-coated alumina, ceria-coated titania, ceria-coated zirconia, or any other ceria-coated inorganic oxide particles.

The preferred ceria-coated inorganic oxide particles are ceria-coated colloidal silica particles.

The particle sizes measured by a known method, such as Dynamic Light Scattering, of these ceria-coated inorganic oxide particles in the disclosed invention herein are ranged from 10 nm to 1,000 nm, the preferred mean particle sized are ranged from 20 nm to 500 nm, the more preferred mean particle sizes are ranged from 50 nm to 250 nm.

The concentrations of these ceria-coated inorganic oxide particles range from 0.01 wt. % to 20 wt. %, the preferred concentrations range from 0.05 wt. % to 10 wt. %, the more preferred concentrations range from 0.1 wt. % to 5 wt. %.

The water-based solvent includes but is not limited to deionized (DI) water, distilled water, and alcoholic organic water-based solvents.

The preferred water-based solvent is DI water.

The STI CMP slurry may contain biocide ranging from 0.0001 wt. % to 0.05 wt. %; preferably from 0.0005 wt. % to 0.025 wt. %, and more preferably from 0.001 wt. % to 0.01 wt. %.

The biocide includes, but is not limited to, Kathon™, Kathon™ CG/ICP II, from Dupont/Dow Chemical Co. Bioban from Dupont/Dow Chemical Co. They have active ingredients of 5-chloro-2-methyl-4-isothiazolin-3-one and 2-methyl-4-isothiazolin-3-one.

The STI CMP slurry may contain a pH adjustor.

An acidic or basic pH adjustor can be used to adjust the STI polishing compositions to the optimized pH value.

The acidic pH adjustors include, but are not limited to nitric acid, hydrochloric acid, sulfuric acid, phosphoric acid, other inorganic or organic acids, and mixtures thereof.

pH adjustors also include the basic pH adjustors, such as sodium hydride, potassium hydroxide, ammonium hydroxide, tetraalkyl ammonium hydroxide, organic quaternary ammonium hydroxide compounds, organic amines, and other chemical reagents that can be used to adjust pH towards the more alkaline direction.

The STI CMP slurry contains 0 wt. % to 1 wt. %; preferably 0.01 wt. % to 0.5 wt. %; more preferably 0.1 wt. % to 0.25 wt. % of a pH adjustor.

The organic polymer acid, its ester derivatives, its 2-alkyl group substituted derivatives (2-alkyl group is selected from methyl, ethyl, propyl, butyl, pentyl or hexyl group), or its salts used as oxide trench dishing reducers have a general molecular structure as shown below:

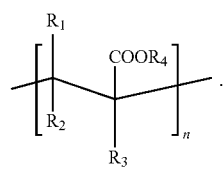

Where R1, R2, and R4 can be selected independently from the group consisting of hydrogen, alkyl groups; R4 can also be metal ions or ammonium ions, such as Na+, K+ or NH4+; and R3 is selected from alkyl groups. Where the alkyl groups are $C_mH_{2m+1}$ m is from 1 to 10, 1 to 6, 1 to 4, or 1 to 2; such as methyl, ethyl groups.

n is chosen to give the molecular weights in the range from 1,000 to 1,000,000; preferably 1,200 to 100,000; and more preferably 1,500 to 15,000.

When R1, R2, and R4 are hydrogen atoms and R3 is methyl group, molecular structure (a) of Poly(methacrylic acid) is shown below:

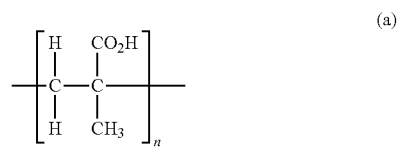

When R1 and R2 are hydrogen atoms, R3 is methyl group, and R4 is a metal ion, then the molecular structure (b) of poly(methacrylic acid) salt is shown below:

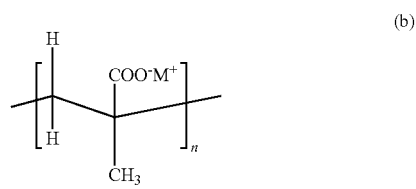

The poly(methacrylic acid) salts include but are not limited to poly (methacrylic acid) ammonium salts, poly (methacrylic acid) sodium salts, poly (methacrylic acid) potassium salts, or combinations thereof. The preferred poly(methacrylic acid) salt is poly(methacrylic acid) ammonium salt.

When R1 and R2 are hydrogen atoms, R3 and R4 are methyl group, the molecular structure of poly (methyl methacrylate) (PMMA) is shown below:

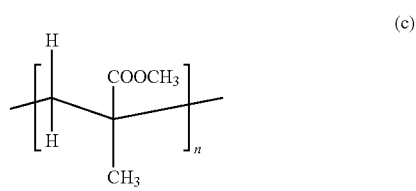

When R1 and R2 are hydrogen atoms, R3 is methyl group, and R4 is ethyl group, the molecular structure of poly (ethyl methacrylate) (PEMA) is shown below:

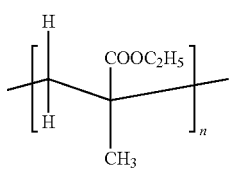

(d)

When R1 and R4 are hydrogen atoms, R2 and R3 are methyl group, the molecular structure of 2-methyl-poly (methacrylic acid) is shown below:

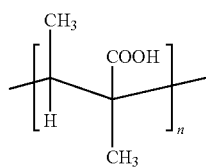

(e)

The STI CMP slurry contains 0.001 wt. % to 2.0% wt. %, preferably 0.005 wt. % to 0.75 wt. %, and preferable 0.01 wt. % to 0.5 wt. % of the oxide trenching dishing reducer.

In another aspect, there is provided a method of chemical mechanical polishing (CMP) a substrate having at least one surface comprising silicon dioxide using the chemical mechanical polishing (CMP) composition described above in Shallow Trench Isolation (STI) process.

In another aspect, there is provided a system of chemical mechanical polishing (CMP) a substrate having at least one surface comprising silicon dioxide using the chemical mechanical polishing (CMP) composition described above in Shallow Trench Isolation (STI) process.

The polished oxide films can be Chemical vapor deposition (CVD), Plasma Enhance CVD (PECVD), High Density Deposition CVD (HDP), or spin on oxide films.

The substrate disclosed above can further comprises a silicon nitride surface. The removal selectivity of $SiO_2$:SiN is greater than 10, preferably greater than 20, and more preferably greater than 30.

In another aspect, there is provided a method of chemical mechanical polishing (CMP) a substrate having at least one surface comprising silicon dioxide using the chemical mechanical polishing (CMP) composition described above in Shallow Trench Isolation (STI) process. The polished oxide films can be CVD oxide, PECVD oxide, High density oxide, or Spin on oxide films.

The following non-limiting examples are presented to further illustrate the present invention.

CMP Methodology

In the examples presented below, CMP experiments were run using the procedures and experimental conditions given below.

Glossary

Components

Ceria-coated Silica: used as abrasive having a particle size of approximately 100 nanometers (nm); such ceria-coated silica particles can have a particle size of ranged from approximately 20 nanometers (nm) to 500 nanometers (nm).

Ceria-coated Silica particles (with varied sizes) were supplied by JGC Inc. in Japan.

Chemical additives, poly(methacrylic acid) or salts were supplied by Sigma-Aldrich, St. Louis, Mo.

Chemical additives, polyacrylic acid ammonium salts (PAAAS) were supplied by

Kao Chemicals Inc. in Japan.

TEOS: tetraethyl orthosilicate

Polishing Pad: Polishing pad, IC1010 and other pads were used during CMP, supplied by DOW, Inc.

Parameters

General

Å or A: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: slurry flow, ml/min
Wt. %: weight percentage (of a listed component)
TEOS:SiN Selectivity: (removal rate of TEOS)/(removal rate of SiN)
HDP: high density plasma deposited TEOS
TEOS or HDP Removal Rates: Measured TEOS or HDP removal rate at a given down pressure. The down pressure of the CMP tool was 2.0, 3.0 or 4.0 psi in the examples listed below.
SiN Removal Rates: Measured SiN removal rate at a given down pressure. The down pressure of the CMP tool was 3.0 psi in the examples listed.

Metrology

Films were measured with a ResMap CDE, model 168, manufactured by Creative Design Engineering, Inc, 20565 Alves Dr., Cupertino, Calif., 95014. The ResMap tool is a four-point probe sheet resistance tool. Forty-nine-point diameter scan at 5 mm edge exclusion for film was taken.

CMP Tool

The CMP tool that was used is a 200 mm Mirra, or 300 mm Reflexion manufactured by Applied Materials, 3050 Boweres Avenue, Santa Clara, Calif., 95054. An IC1000 pad supplied by DOW, Inc, 451 Bellevue Rd., Newark, Del. 19713 was used on platen 1 for blanket and pattern wafer studies.

The IC1010 pad or other pad was broken in by conditioning the pad for 18 mins. At 7 lbs. down force on the conditioner. To qualify the tool settings and the pad break-in two tungsten monitors and two TEOS monitors were polished with Versum® STI2305 slurry, supplied by Versum Materials Inc. at baseline conditions.

Wafers

Polishing experiments were conducted using PECVD or LECVD or HD TEOS wafers. These blanket wafers were purchased from Silicon Valley Microelectronics, 2985 Kifer Rd., Santa Clara, Calif. 95051.

Polishing Experiments

In blanket wafer studies, oxide blanket wafers, and SiN blanket wafers were polished at baseline conditions. The tool baseline conditions were: table speed; 87 rpm, head speed: 93 rpm, membrane pressure; 3.0 psi, slurry flow; 200 ml/min.

The slurry was used in polishing experiments on patterned wafers (MIT860) which were supplied by SWK Associates, Inc. 2920 Scott Blvd. Santa Clara, Calif. 95054). These wafers were measured on the Veeco VX300 profiler/AFM instrument. The 2 or 3 different sized pitch structures were used for oxide dishing measurement. The wafer was measured at center, middle, and edge die positions.

TEOS:SiN Selectivity: (removal rate of TEOS)/(removal rate of SiN) obtained from the STI CMP polishing compositions were tunable.

WORKING EXAMPLES

In the following working examples, a STI polishing composition comprising 0.2 wt. % cerium-coated silica, a biocide ranging from 0.0001 wt. % to 0.05 wt. %, and deionized water was prepared as base or reference composition.

The STI CMP polishing compositions comprised additional chemical additives, such poly (methacrylic acid) (PMAA) with structure (a) with different molecular weights and/or polyacrylic acid ammonium salt (PAAAS) with around 3000 molecular weights.

pH of the compositions was adjusted by using nitric acid or ammonium hydroxide.

Example 1

In Example 1, the polishing compositions were prepared as shown in Table 1. pH was around 5.35 for the compositions.

The chemical additives poly(methacrylic acid) (PMAA) or its deionized form (deionized PMAA) having MW around 5,000 were used at 0.10 wt. %, respectively as shown in Table 1.

The removal rates (RR at Å/min) for different films were tested. The results were shown in Table 1.

The effects of PMAA having 5,000 molecular weights or its deionized form on the film removal rates and selectivity were observed.

TABLE 1

Effects of Additives on Film RRs & Selectivity

| Compositions | TEOS RR (Å/min.) | HDP RR (Å/min.) | SiN RR (Å/min.) | TEOS:SiN Selectivity |
|---|---|---|---|---|
| 0.2% Ceria-Coated Silica | 3436 | 2929 | 337 | 10:1 |
| +0.1x PMAA | 1345 | 2220 | 157 | 9:1 |
| +0.1x Deionized PMAA | 1239 | 2063 | 137 | 9:1 |

As shown in Table 1, the addition of the chemical additives of poly (methacrylic acid)(PMAA), or its deionized form, reduced the removal rates for all tested films. Similar TEOS:SiN film polishing selectivity were obtained.

Example 2

In Example 2, the polishing compositions were prepared as shown in Table 2. The CMP polishing compositions have pH values at 5.35.

The chemical additives poly(methacrylic acid) having molecular weights around 5,000 was used at 0.10 wt. %.

The oxide trenching 100 μm and 200 μm dishing vs over polishing amounts were tested and the results were shown in Table 2.

TABLE 2

Effects of PMAA on Oxide Trench Dishing vs OP Amt.

| Compositions | Over Polishing Amt. (Å) | P100 μm Trench Dishing Rate(Å/min.) | P200 μm Trench Dishing Rate(Å/min.) |
|---|---|---|---|
| 0.2% Ceria-Coated Silica | 3006Å/60 sec. | 985 | 1165 |
| | 6012Å/120 sec. | 913 | 1132 |
| +0.1x PMAA | 2377Å/60 sec. | 224 | 327 |
| | 4754Å/120 sec. | 295 | 388 |

As the results shown in Table 2, the addition of 0.1 wt. % PMAA with 5,000 MW into the reference STI CMP polishing composition having 0.2 wt. % ceria-coated silica abrasives significantly reduced oxide trench dishing, the oxide trench dishing reduction was by >100% for both different sized oxide trench features.

Dishing was significantly reduced with the use of MW 5,000 PMAA as oxide trench dishing reducer vs different over polishing thickness of oxide films.

Example 3

In example 3, the polishing compositions were prepared as shown in Table 3. In the listed polishing compositions, 0.2 wt. % ceria-coated silica was used as abrasives in reference and all three tested samples. pH was around 5.35 for each of these compositions.

The deionized PMAA with molecular weight 5,000 was used at 0.05 wt. %, 0.1 wt. %, and 0.15 wt. % respectively.

Removal rates from those polishing compositions were tested and shown in Table 3.

TABLE 3

Film RRs from Polishing Compositions having PMAA at Different %

| Compositions | TEOS RR (Å/min.) | HDP RR (Å/min.) | SiN RR (Å/min.) | TEOS:SiN Selectivity |
|---|---|---|---|---|
| 0.2% Ceria-Coated Silica | 3436 | 2929 | 337 | 10:1 |
| +0.05x PMAA | 1387 | 2083 | 111 | 12:1 |
| +0.1x PMAA | 1583 | 2164 | 130 | 12:1 |
| +0.15x PMAA | 1514 | 2027 | 116 | 13:1 |

As the results shown in Table 3, all three types of film removal rates were reduced when different concentrations of PMAA was used as chemical additive in the polishing compositions, but the concentration changes of PMAA with MW 5,000 within the tested range had no significant effects on TEOS, HDP, SiN film removal rates, and using PMAA as chemical additive in the polishing compositions increased TEOS:SiN selectivity slightly.

The effects of PMAA concentrations on various sized oxide trench loss rates were listed in Table 4.

TABLE 4

Effects of PMAA% on Oxide Trench Loss Rates

| Compositions | P100 μm Trench Loss Rate (Å/sec.) | P200 μm Trench Loss Rate (Å/sec.) |
|---|---|---|
| 0.2% Ceria-Coated Silica | 19.6 | 21.1 |
| +0.05x PMAA | 6.4 | 4.8 |
| +0.1x PMAA | 2.8 | 3.7 |
| +0.15x PMAA | 2.6 | 3.9 |

As showed in Table 4, the oxide trench loss rates were significantly reduced when PMAA was used at different wt. % concentrations on 100 μm and 200 μm oxide trench features while comparing with the polishing composition only using 0.2 wt. % ceria-coated silica reference sample.

The results shown in Table 4 also shown that when PMAA concentrations were used at 0.1 wt. % or at 0.15 wt. %, significant oxide trench loss rates were obtained while comparing the polishing composition used 0.05 wt. % PMAA as chemical additive.

The effects of PMAA concentrations on various sized oxide trench dishing rates were listed in Table 5.

TABLE 5

Effects of PMAA % on Oxide Trench Dishing Rates

| Compositions | P100 μm Trench Dishing Rate (Å/sec.) | P200 μm Trench Dishing Rate (Å/sec.) |
|---|---|---|
| 0.2% Ceria-Coated Silica | 6.3 | 8.9 |
| +0.05x PMAA | 2.6 | 3.8 |
| +0.1x PMAA | 1.9 | 2.6 |
| +0.15x PMAA | 1.3 | 3.0 |

As the results shown in Table 5, the oxide trench dishing rates were reduced significantly when PMAA was used at 0.05 wt. %, 0.1 wt. % or 0.15 wt. % on 100 μm and 200 μm oxide trench features while comparing the dishing rates on these two oxide trench features obtained with the polishing composition only using 0.2 wt. % ceria-coated silica abrasive based polishing composition.

Example 4

In example 4, the effects of pH conditions on film removal rates, oxide trenching loss rates, and oxide trench dishing rates were tested for compositions using 0.1 wt. % PMAA having 5,000 MW and 0.2 wt. % ceria-coated silica as abrasives.

The results of the effects of pH on Film were listed in Table 6.

TABLE 6

Effects of pH on Film RR

| 0.2% Ceria-Coated Silica + 0.1% PMAA | TEOS RR (Å/min.) | HDP RR (Å/min.) | SiN RR (Å/min.) | TEOS:SiN Selectivity |
|---|---|---|---|---|
| pH 5.35 | 1583 | 2164 | 130 | 12:1 |
| pH 6 | 2125 | 2476 | 128 | 17:1 |
| pH 8 | 2037 | 1930 | 107 | 19:1 |

As the results shown in Table 6, the removal rates for TEOS film were increased as pH increased from 5.35 to 6 or from 5.35 to 8. The HDP film removal rate was increased as pH increased from 5.35 to 6, then, slightly reduced as pH increased from 5.35 to 8. The TEOS:SiN selectivity were increased as pH increased from 5.35 to 6, and 8 respectively.

The effects of pH conditions of the polishing compositions on various sized oxide trench loss rates were listed in Table 7.

TABLE 7

Effects of pH Conditions on Oxide Trench Loss Rates

| 0.2% Ceria-Coated Silica + 0.1% PMAA | P100 μm Trench Loss Rate (Å/sec.) | P200 μm Trench Loss Rate (Å/sec.) |
|---|---|---|
| pH 5.35 | 2.8 | 3.7 |
| pH 6 | 4.3 | 5.8 |
| pH 8 | 18.4 | 19.5 |

The effects of pH conditions on various sized oxide trench dishing rates were listed in Table 8.

TABLE 8

Effects of pH Conditions on Oxide Trench Dishing Rates

| 0.2% Ceria-Coated Silica + 0.1% PMAA | P100 μm Trench Dishing Rate (Å/sec.) | P200 μm Trench Dishing Rate (Å/sec.) |
|---|---|---|
| pH 5.35 | 1.9 | 2.6 |
| pH 6 | 3.1 | 4.3 |
| pH 8 | 7.8 | 9.5 |

As showed in Table 7, in overall, the composition at pH 5.35 showed the lowest oxide trench loss rates across all tested oxide trench features.

As showed in Table 8, in overall, the composition at pH 5.35 showed the lowest oxide trench dishing rates across all tested oxide trench features.

Example 5

In example 5, the tests were performed with PMAA having different MW: 5,000, 15,000 and 100,000. The compositions comprised 0.1 wt. % PMAA and 0.2 wt. % ceria-coated silica as abrasives. pH of the compositions was at 5.35.

The results from different molecular weights of PMAA or poly (methacrylic acid) ammonium salts (PMAAAM) on the film removal rates and TEOS:SiN selectivity were listed in Table 9.

TABLE 9

Effects of Different MW of PMAA or Its Salt on Film RR & TEOS:SiN Selectivity

| Compositions | TEOS RR (Å/min.) | HDP RR (Å/min.) | SiN RR (Å/min.) | TEOS:SiN Selectivity |
|---|---|---|---|---|
| 0.2% Ceria-Coated Silica | 3867 | 2718 | 378 | 10:1 |
| +0.1x PMAA MW 5K | 1544 | 2377 | 141 | 11:1 |
| +0.1X PMAAAM MW 15K | 1556 | 2403 | 123 | 13:1 |
| +0.1x PMAA MW 100K | 761 | 1178 | 104 | 7:1 |

As the results showed in Table 9, using PMAA or its salt as oxide trench dishing reducing agent suppressed TEOS, HDP and SiN removal rates. The selectivity of TEOS:SiN was kept high and increased for PMAA MW<100,000 from MW 5K to 15K.

Different molecular weights of PMAA or poly (methacrylic acid) ammonium salts (PMAAAM) as chemical additives to reduce oxide trench dishing were tested. The results were listed in Table 10.

TABLE 10

Effects of Different MW of PMAA or Its Salt on Oxide Trench Dishing Rates

| Compositions | P 100 µm Trench Dishing Rate (Å/sec.) | P200 µm Trench Dishing Rate (Å/sec.) |
| --- | --- | --- |
| 0.2% Ceria-Coated Silica | 8.7 | 10.3 |
| +0.1x PMAA MW 5K | 1.9 | 2.6 |
| +0.1x PMAAAM MW 15K | 3.0 | 7.6 |
| +0.1x PMAA MW 100K | 2.9 | 4.1 |

As the results showed in Table 10, using PMAA or its salt as oxide trench dishing reducing agents provided the reduced oxide trench dishing performances on 100 µm and 200 µm oxide trench features.

Example 6

In example 6, two chemical additives, polyacrylic acid ammonium salt, (PAAAS) vs PMAA were compared on their effects on oxide polishing composition performances.

The compositions comprised 0.2 wt. % ceria-coated silica as abrasives. pH of the compositions at 5.35 was used as reference sample.

The effects of PAAAS or PMAA as chemical additives in the polishing compositions on HDP film and SiN film removal rates were studied and the results were listed in Table 11.

As the results shown in Table 11, at same pH and same abrasive concentration conditions, 0.1 wt. % PAAAS significantly suppressed HDP oxide film removal rate while comparing the HDP film removal rate obtained using 0.1 wt. % PMAA as chemical additive in the polishing composition. The composition of ceria-coated silica and 0.1 wt. % PAAAS salt used in the composition would not offer an acceptable removal rate of HDP.

TABLE 11

Effects of PAA Salt vs PMAA on Film Removal Rates

| Compositions | Blanket HDP RR (Å/min) | Blanket PECVD SiN RR (Å/min) |
| --- | --- | --- |
| 0.2% Ceria-coated Silica | 2771 | 359 |
| +0.01% PAAAS | 2104 | 51 |
| +0.1% PAAAS | 570 | 107 |
| +0.05% PMAA | 2083 | 111 |
| +0.1% PMAA | 2164 | 130 |

The effects of PAAAS or PMAA as chemical additives in the polishing compositions employed ceria-coated silica particles as abrasives on P200 µm trench rates and P200 µm Trench RR/Blanket HDP film RR ratios were studied, and the results were listed in Table 12.

TABLE 12

Effects of PAA Salt vs PMAA on P200 Trench Rates & P200 Trench RR/Blanket RR Ratios

| Compositions | P200 Trench Rate (Å/sec) | P200 Trench Rate (Å/min) | P200 Trench RR/Blanket RR Ratio |
| --- | --- | --- | --- |
| 0.2% Ceria-coated Silica, pH 5.35 | 19.2 | 1152 | 0.42 |
| +0.01% PAAAS | 17.6 | 1057 | 0.5 |
| +0.1% PAAAS | 4.2 | 250 | 0.44 |
| +0.05% PMAA | 4.8 | 285 | 0.14 |
| +0.1% PMAA | 3.7 | 224 | 0.1 |

As the results shown in Table 12, at same pH and same abrasive concentration conditions, the polishing compositions using 0.05 wt. % or 0.1 wt. % PMAA as chemical additive salt significantly reduced the P200 mm trench RR/Blanket HDP RR ratios than such ratios obtained from reference sample without using chemical additive or the polishing compositions using 0.01 wt. % or 0.1 wt. % PAAAS as chemical additives.

Different sized oxide trench RR/Blanket oxide film RR ratio is a key parameter to judge on whether the oxide polishing composition can afford lower oxide dishing while used for oxide polishing CMP applications. In general, the smaller of such ratios are, the lower of oxide trench dishing are.

The effects of PAAAS or PMAA as chemical additives in the polishing compositions employed ceria-coated silica particles as abrasives on P200 µm trench dishing vs the over polished removal amounts were studied, and the results were listed in Table 13.

TABLE 13

Effects of PAA Salt vs PMAA on P200 Trench Dishing vs OP Amt.

| Compositions | Blanket HDP RR (Å/min) | P200 Dishing (Å), 1000A OP Amt. | P200 Dishing (Å), 1500A OP Amt. |
| --- | --- | --- | --- |
| 0.19% Ceria-coated Silica + 0.14% PAAAS | 1974 | 228 | 371 |
| 0.2% Ceria-coated Silica + 0.1% PMAA | 2220 | 44 | 52 |

As the results shown in Table 13, at same pH and same abrasive concentration conditions, the HDP film removal rates were tuned to the similar removal rates so that the trench dishing data vs the over polished removal amounts could be compared more relatively.

The P200 µm dishing vs two different over polishing removal amounts demonstrated significant lower oxide trench dishing vs over polishing amounts when using PMAA as chemical additives than that trenching dishing vs over polishing amounts when using PAAAS as chemical additive in the polishing composition.

The example 6 had shown that the polishing composition used PMAA as the chemical additive provided significant oxide trench dishing reduction than the polishing composition used PAAAS as chemical additive at same pH and same abrasive concentrations.

The embodiments of this invention listed above, including the working example, are exemplary of numerous embodiments that may be made of this invention. It is contemplated that numerous other configurations of the process may be used, and the materials used in the process may be elected from numerous materials other than those specifically disclosed.

The invention claimed is:

1. A chemical mechanical polishing composition comprising:
   ceria-coated inorganic oxide particles;
   oxide trenching dishing reducer selected from the group consisting of organic polymer acid, its ester derivative, its salt, and combinations thereof;
   water based solvent; and
   optionally
   biocide; and
   pH adjuster;
   wherein
   the composition has a pH of 3 to 10; and
   the oxide trench dishing reducer has a general molecular structure as shown below:

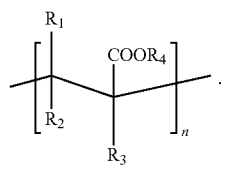

wherein R1 and R2 each independently is selected from the group consisting of hydrogen and an alkyl group $C_mH_{2m+1}$ and m is from 1 to 4; R3 is an alkyl group $C_mH_{2m+1}$ and m is from 1 to 4; R4 is selected from the group consisting of hydrogen, an alkyl group $C_mH_{2m+1}$ and m is from 1 to 4, metal ion, and ammonium ion; and n is chosen to give a molecular weight from 1,000 to 1,000,000.

2. The chemical mechanical polishing composition of claim 1, wherein
   the ceria-coated inorganic oxide particles are selected from the group consisting of ceria-coated colloidal silica, ceria-coated high purity colloidal silica, ceria-coated alumina, ceria-coated titania, ceria-coated zirconia particles and combinations thereof;
   the oxide trench dishing reducer has a general molecular structure selected from the group consisting of:
   (a) poly(methacrylic acid) when R1, R2, and R4 are hydrogen, and R3 is methyl;

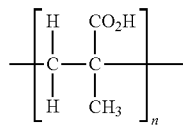

(b) salt of poly(methacrylic acid) when R1 and R2 are hydrogen, R3 is methyl, and R4 is a metal ion or ammonium $M^+$;

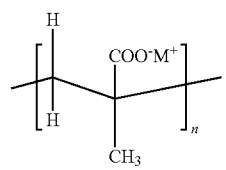

(c) poly (methyl methacrylate) (PMMA) when R1 and R2 are hydrogen, R3 and R4 are methyl;

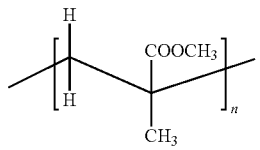

(d) poly (ethyl methacrylate) (PEMA) when R1 and R2 are hydrogen, R3 is methyl, and R4 is ethyl;

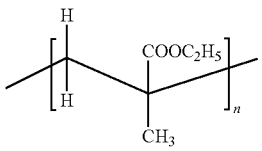

(e) 2-methyl-poly (methacrylic acid) when R1 and R4 are hydrogen, R2 and R3 are methyl;

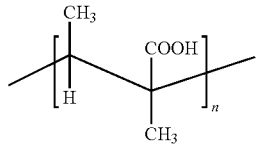

and combinations thereof; and
   the water based solvent is selected from the group consisting of deionized (DI) water, distilled water, and alcoholic organic water based solvents.

3. The chemical mechanical polishing composition of claim 1, wherein the chemical mechanical polishing composition further comprises at least one of the biocide having an active ingredient selected from the group consisting of 5-chloro-2-methyl-4-isothiazolin-3-one, 2-methyl-4-isothiazolin-3-one, and combinations thereof; and the pH adjustor selected from the group consisting of nitric acid, hydrochloric acid, sulfuric acid, phosphoric acid, and combinations thereof for acidic pH conditions; or is selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

4. The chemical mechanical polishing composition of claim 1, wherein
   the ceria-coated inorganic oxide particles are consisting of ceria-coated colloidal silica, ceria-coated high purity colloidal silica, and combinations thereof;
   the oxide trench dishing reducer has a molecular weight of 1,200 to 100,000 and is selected from the group consisting of poly (methacrylic acid), salt of poly (methacrylic acid), and combinations thereof;
   the water based solvent is deionized (DI) water; and
   the chemical mechanical polishing composition has a pH of 3.5 to 9.

5. The chemical mechanical polishing composition of claim 1, wherein the chemical mechanical polishing composition comprises
   the ceria-coated inorganic oxide particles are selected from the group consisting of ceria-coated colloidal silica, ceria-coated high purity colloidal silica, and combinations thereof;

the oxide trench dishing reducer has a molecular weight of 1,500 to 15000 and is selected from the group consisting of poly (methacrylic acid), salt of poly (methacrylic acid), and combinations thereof;

deionized (DI) water;

the biocide having an active ingredient selected from the group consisting of 5-chloro-2-methyl-4-isothiazolin-3-one, 2-methyl-4-isothiazolin-3-one, and combinations thereof;

nitric acid or ammonium hydroxide; and the chemical mechanical polishing composition has a pH of 4 to 7.

6. The chemical mechanical polishing composition of claim 1 comprises ceria-coated colloidal silica; poly (methacrylic acids) having a molecular weight of 1,200 to 100,000; deionized (DI) water; and the chemical mechanical polishing composition has a pH of 3.5 to 9.

7. The chemical mechanical polishing composition of claim 1, wherein the chemical mechanical polishing composition comprises ceria-coated colloidal silica;

poly (methacrylic acids) having a molecular weight of 1,200 to 100,000;

deionized (DI) water;

the biocide having an active ingredient selected from the group consisting of 5-chloro-2-methyl-4-isothiazolin-3-one, 2-methyl-4-isothiazolin-3-one, and combinations thereof;

nitric acid or ammonium hydroxide;

and the chemical mechanical polishing composition has a pH of 4 to 7.

8. A method of chemical mechanical polishing (CMP) a semiconductor substrate having at least one surface comprising silicon oxide film, comprising providing the semiconductor substrate;

providing a polishing pad;

providing the chemical mechanical polishing (CMP) composition comprising ceria-coated inorganic oxide particles;

oxide trenching dishing reducer selected from the group consisting of organic polymer acid, its ester derivative, its salt, and combinations thereof;

water based solvent; and optionally biocide; and pH adjuster;

wherein the composition has a pH of 3 to 9; and the oxide trench dishing reducer has a general molecular structure as shown below:

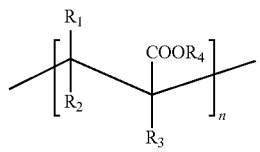

wherein R1 and R2 each independently is selected from the group consisting of hydrogen and an alkyl group $C_mH_{2m+1}$ and m is from 1 to 4; R3 is an alkyl group $C_mH_{2m+1}$ and m is from 1 to 4; R4 is selected from the group consisting of hydrogen, an alkyl group $C_mH_{2m+1}$ and m is from 1 to 4, metal ion, and ammonium ion; and n is chosen to give a molecular weight in from 1,000 to 1,000,000;

contacting the at least one surface of the semiconductor substrate with the polishing pad and the chemical mechanical polishing composition; and polishing the at least one surface comprising the silicon oxide film;

wherein the silicon oxide film is selected from the group consisting of Chemical vapor deposition (CVD), Plasma Enhance CVD (PECVD), High Density Deposition CVD (HDP), or spin on silicon oxide film.

9. The method of claim 8; wherein the ceria-coated inorganic oxide particles are selected from the group consisting of ceria-coated colloidal silica, ceria-coated high purity colloidal silica, ceria-coated alumina, ceria-coated titania, ceria-coated zirconia particles and combinations thereof;

the oxide trench dishing reducer has a general molecular structure selected from the group consisting of:

(a) poly(methacrylic acid) when R1, R2, and R4 are hydrogen, and R3 is methyl;

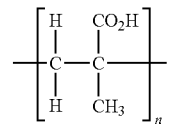

(b) salt of poly(methacrylic acid) when R1 and R2 are hydrogen, R3 is methyl, and R4 is a metal ion or ammonium $M^+$;

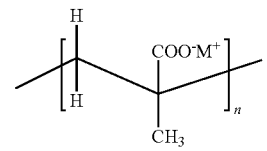

(c) poly (methyl methacrylate) (PMMA) when R1 and R2 are hydrogen, R3 and R4 are methyl;

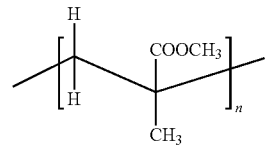

(d) poly (ethyl methacrylate) (PEMA) when R1 and R2 are hydrogen, R3 is methyl, and R4 is ethyl;

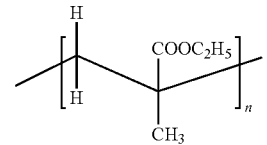

(e) 2-methyl-poly (methacrylic acid) when R1 and R4 are hydrogen, R2 and R3 are methyl;

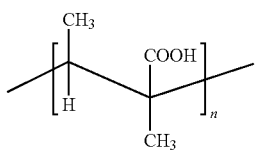

and combinations thereof; and
the water based solvent is selected from the group consisting of deionized (DI) water, distilled water, and alcoholic organic water based solvents.

10. The method of claim 8; wherein the chemical mechanical polishing composition further comprises at least one of
the biocide having an active ingredient selected from the group consisting of 5-chloro-2-methyl-4-isothiazolin-3-one, 2-methyl-4-isothiazolin-3-one, and combinations thereof; and
the pH adjustor selected from the group consisting of nitric acid, hydrochloric acid, sulfuric acid, phosphoric acid, and combinations thereof for acidic pH conditions; or is selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

11. The method of claim 8; wherein the chemical mechanical polishing composition comprises
the ceria-coated inorganic oxide particles selected from the group consisting of ceria-coated colloidal silica, ceria-coated high purity colloidal silica, and combinations thereof;
the oxide trench dishing reducer having a molecular weight of 1,200 to 100,000 and is selected from the group consisting of poly (methacrylic acid), salt of poly(methacrylic acid), and combinations thereof;
deionized (DI) water.

12. The method of claim 8; wherein the chemical mechanical polishing composition comprises
the ceria-coated inorganic oxide particles are selected from the group consisting of ceria-coated colloidal silica, ceria-coated high purity colloidal silica, and combinations thereof;
the oxide trench dishing reducer has a molecular weight of 1,500 to 15000 and is selected from the group consisting of poly (methacrylic acid), salt of poly (methacrylic acid), and combinations thereof;
deionized (DI) water;
the biocide having an active ingredient selected from the group consisting of 5-chloro-2-methyl-4-isothiazolin-3-one, 2-methyl-4-isothiazolin-3-one, and combinations thereof;
nitric acid or ammonium hydroxide;
and the chemical mechanical polishing composition has a pH of 4 to 7.

13. The method of claim 8; wherein the chemical mechanical polishing composition comprises ceria-coated colloidal silica; poly (methacrylic acids) having a molecular weight of 1,200 to 100,000; and deionized (DI) water.

14. The method of claim 8; wherein the chemical mechanical polishing composition comprises
ceria-coated colloidal silica;
poly (methacrylic acids) having a molecular weight of 1,500 to 15000;
deionized (DI) water;
the biocide having an active ingredient selected from the group consisting of 5-chloro-2-methyl-4-isothiazolin-3-one, 2-methyl-4-isothiazolin-3-one, and combinations thereof;
nitric acid or ammonium hydroxide;
and the chemical mechanical polishing composition has a pH of 4 to 7.

15. The method of claim 8; wherein
the silicon oxide film is $SiO_2$ film;
the semiconductor substrate further having at least one surface comprises a silicon nitride film;
the method further comprises a step of polishing the nitride film; and
removal selectivity of silicon oxide: silicon nitride is greater than 10.

16. A system of chemical mechanical polishing (CMP) a semiconductor substrate having at least one surface comprising silicon oxide film, comprising
a. the semiconductor substrate;
b. the chemical mechanical polishing (CMP) composition comprising
ceria-coated inorganic oxide particles;
oxide trenching dishing reducer selected from the group consisting of organic polymer acid, its ester derivative, its salt, and combinations thereof;
water based solvent; and
optionally
biocide; and
pH adjuster;
wherein
the composition has a pH of 3.5 to 9; and
the oxide trench dishing reducer has a general molecular structure as shown below:

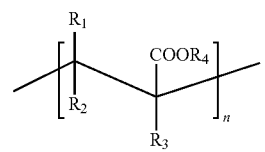

wherein R1 and R2 each independently is selected from the group consisting of hydrogen and an alkyl group $C_mH_{2m+1}$ and m is from 1 to 4; R3 is an alkyl group $C_mH_{2m+1}$ and m is from 1 to 4; R4 is selected from the group consisting of hydrogen, an alkyl group $C_mH_{2m+1}$ and m is from 1 to 4, metal ion, and ammonium ion; and n is chosen to give a molecular weight from 1,000 to 1,000,000;
c. a polishing pad;
wherein the silicon oxide film is selected from the group consisting of Chemical vapor deposition (CVD), Plasma Enhance CVD (PECVD), High Density Deposition CVD (HDP), or spin on silicon oxide film; and the at least one surface comprising the silicon oxide film is in contact with the polishing pad and the chemical mechanical polishing composition.

17. The system of claim 16; wherein
the ceria-coated inorganic oxide particles are selected from the group consisting of ceria-coated colloidal silica, ceria-coated high purity colloidal silica, ceria-coated alumina, ceria-coated titania, ceria-coated zirconia particles and combinations thereof;

the oxide trench dishing reducer has a general molecular structure selected from the group consisting of:

(a) poly(methacrylic acid) when R1, R2, and R4 are hydrogen, and R3 is methyl;

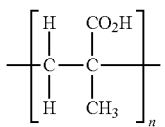

(b) salt of poly(methacrylic acid) when R1 and R2 are hydrogen, R3 is methyl, and R4 is a metal ion or ammonium $M^+$;

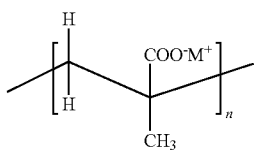

(c) poly (methyl methacrylate) (PMMA) when R1 and R2 are hydrogen, R3 and R4 are methyl;

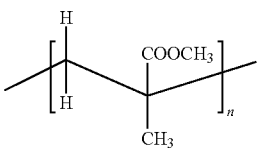

(d) poly (ethyl methacrylate) (PEMA) when R1 and R2 are hydrogen, R3 is methyl, and R4 is ethyl;

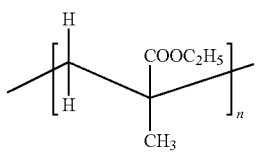

(e) 2-methyl-poly (methacrylic acid) when R1 and R4 are hydrogen, R2 and R3 are methyl;

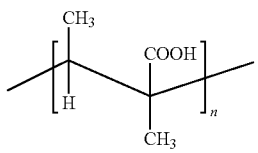

and combinations thereof; and the water based solvent is selected from the group consisting of deionized (DI) water, distilled water, and alcoholic organic water based solvents.

18. The system of claim 16; wherein the chemical mechanical polishing composition further comprises at least one of the biocide having an active ingredient selected from the group consisting of 5-chloro-2-methyl-4-isothiazolin-3-one, 2-methyl-4-isothiazolin-3-one, and combinations thereof; and the pH adjustor selected from the group consisting of nitric acid, hydrochloric acid, sulfuric acid, phosphoric acid, and combinations thereof for acidic pH conditions; or is selected from the group consisting of sodium hydride, potassium hydroxide, ammonium hydroxide, tetraalkyl ammonium hydroxide, organic quaternary ammonium hydroxide compounds, organic amines, and combinations thereof for alkaline pH conditions.

19. The system of claim 16; wherein the chemical mechanical polishing composition comprises the ceria-coated inorganic oxide particles selected from the group consisting of ceria-coated colloidal silica, ceria-coated high purity colloidal silica, and combinations thereof;

the oxide trench dishing reducer having a molecular weight of 1,200 to 100,000 and is selected from the group consisting of poly (methacrylic acid), salt of poly(methacrylic acid), and combinations thereof; and deionized (DI) water.

20. The system of claim 16; the chemical mechanical polishing composition comprises the ceria-coated inorganic oxide particles are selected from the group consisting of ceria-coated colloidal silica, ceria-coated high purity colloidal silica, and combinations thereof;

the oxide trench dishing reducer has a molecular weight of 1,500 to 15000 and is selected from the group consisting of poly (methacrylic acid), salt of poly (methacrylic acid), and combinations thereof;

deionized (DI) water;

the biocide having an active ingredient selected from the group consisting of 5-chloro-2-methyl-4-isothiazolin-3-one, 2-methyl-4-isothiazolin-3-one, and combinations thereof;

nitric acid or ammonium hydroxide;

and the chemical mechanical polishing composition has a pH of 4 to 7.

21. The system of claim 16; wherein the chemical mechanical polishing composition comprises ceria-coated colloidal silica, poly (methacrylic acids) having a molecular weight of 1,500 to 15,000; biocide having an active ingredient selected from the group consisting of 5-chloro-2-methyl-4-isothiazolin-3-one, 2-methyl-4-isothiazolin-3-one, and combinations thereof;

nitric acid or ammonium hydroxide; deionized (DI) water; and the chemical mechanical polishing composition has a pH of 4 to 7.

22. The system of claim 16; wherein
the silicon oxide film is $SiO_2$ film;

the semiconductor substrate further having at least one surface comprises a silicon nitride film, wherein the at least one surface comprising a silicon nitride film is in contact with the polishing pad and the chemical mechanical polishing composition;

the method further comprises a step of polishing the nitride film; and removal selectivity of silicon oxide: silicon nitride is greater than 10, when the at least surface comprising a silicon oxide film and the at least one surface comprising a silicon nitride film are polished with the polishing pad and the chemical mechanical polishing composition.

\* \* \* \* \*